Jan. 18, 1966 L. Z. KERESZTURY 3,229,756

SEMICONDUCTOR HEAT SINK AND/OR COOLER

Filed Jan. 21, 1964

INVENTOR.
LASZLO Z. KERESZTURY
BY
White & Haefliger
ATTORNEYS.

United States Patent Office 3,229,756
Patented Jan. 18, 1966

3,229,756

SEMICONDUCTOR HEAT SINK AND/OR COOLER

Laszlo Z. Keresztury, 2436 Purdue Ave., Los Angeles, Calif.

Filed Jan. 21, 1964, Ser. No. 339,131
9 Claims. (Cl. 165—67)

This invention relates generally to semiconductor cooling arrangements and more particularly concerns improvements therein characterized as providing significant increases in cooling efficiency.

The need for semiconductor cooling devices has been pointed out in several U.S. Patents such as 3,033,537 to Brown et al.; 2,917,286 to Deakin; and 2,964,688 to McAdam. In this regard, certain modern semiconductors are designed and constructed in such manner that their full power capabilities can only be utilized if their casings are kept at low operating temperatures as by means of appropriate cooling devices.

Most presently used cooling devices have two principal functions, namely to extract heat from the semiconductor device, and to transfer the heat to a cooling medium such as air, water, a chassis or cabinet, or electrical current generating junctions, and the like. As to performance of the latter function, there are devices in existence having sufficient heat transfer capacity as to be generally satisfactory. On the other hand and as to performance of the first function mentioned, modern so-called heat sinks generally have the disadvantage of being capable of heat transfer contact with only a small surface portion of the semiconductor device. As a result, the remainder of the device surface is heat insulated by a thin film or layer of air or other fluid medium, so that no matter how cool the heat sink remains, the semiconductor device may still overheat or fail because of insufficient heat transfer between the surface of the semiconductor case and the heat sink.

Accordingly, it is a major object of the invention to provide a novel mounting of the semiconductor device or case to the heat sink in such manner that there is a positive heat conducting pressure contact over considerable and preferably most of the surface of the semiconductor case, providing good transfer of heat into the heat sink. It is a further objective of the invention to incorporate such a desirable mounting for the semiconductor device in an improved insert body characterized as small-sized, efficient, and of light-weight and rugged construction imparting unusual practicality and usefulness to semiconductor installations requiring efficient cooling for reliable operation.

The above objects are realized in practice by providing an insert body which is interiorly recessed upwardly to receive the semiconductor case inwardly of the body skirt or side wall extent, the body also having an interior shoulder located to engage the upper end of the case and thereby limit upward reception thereof into the body recess without preventing inward deflection of the skirt. Furthermore, the skirt is preferably split to accommodate said inward deflection, and it presents exterior camming such as screw cam means for screw turning advancement of the insert into case supporting heat sink structure bringing the insert interior shoulder into forcible engagement with the upper end of the case. The screw cam means also performs the function of effecting cam induced deflection of the skirt inwardly into forcible contact with the outer side of the case during continued turning of the insert while the interior shoulder of the insert body remains in forcible engagement with the upper end of the case. As a result, an extensive and efficient heat dissipation path is established through the insert body and between the case and heat sink structure.

Further objects of the invention include the provision of an insert body having an upper end cap with the interior shoulder at the interior side of the cap so that the heat dissipation path is provided at the upper end as well as at the side of the case; the provision of a buttress-type thread on body skirt segments separated by at least two splits for effecting the camming function of the screw cam means; the clamping of the semiconductor case flange against the heat sink structure in spaced relation below the lower terminal of the insert split skirt and by forcible engagement of the insert body with the case upper end cap; the provision of a mounting stud integral with the insert body cap and the external threading of the heat sink structure for mounting on a panel or the like.

These and other objects and advantages of the invention, as well as the details of an illustrative embodiment, will be more fully understood from the following detailed description of the drawings, in which.

Figure 2:
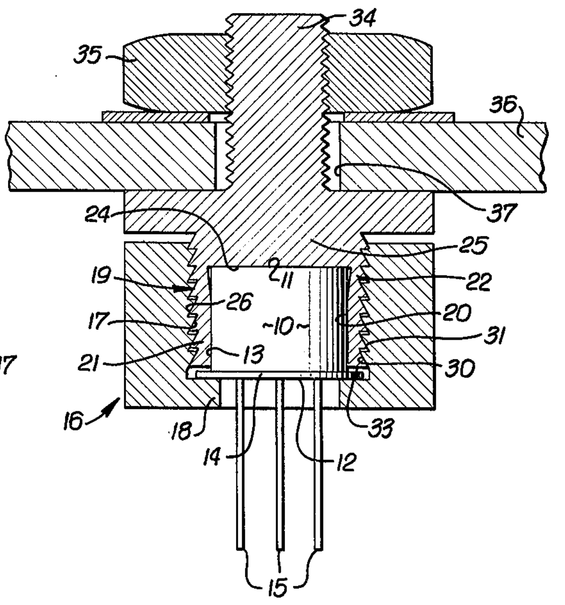
FIG. 2 is a vertical section through a modified form of the invention showing the assembled relation of the heat sink structure, semiconductor case and insert body which is connected to a panel.

Referring first to FIG. 2, a semiconductor metal case is shown generally at 10 as having upper and lower ends 11 and 12 and a peripheral generally cylindrical outer side 13. Typically, the case is flanged as seen at 14 adjacent the bottom end 12, with electrical leads 15 projecting downwardly below the case.

Case supporting structure, typically metallic, is indicated at 16, and has internal screw cam threads 17 and an internal flange 18 forming a through opening. The latter typically supports the bottom end of the case 10 as by annular supporting engagement with the case flange 14, so that the leads 15 project downwardly through the opening formed by the internal flange 18, the case side 13 being spaced inwardly of threads 17.

Figure 1:
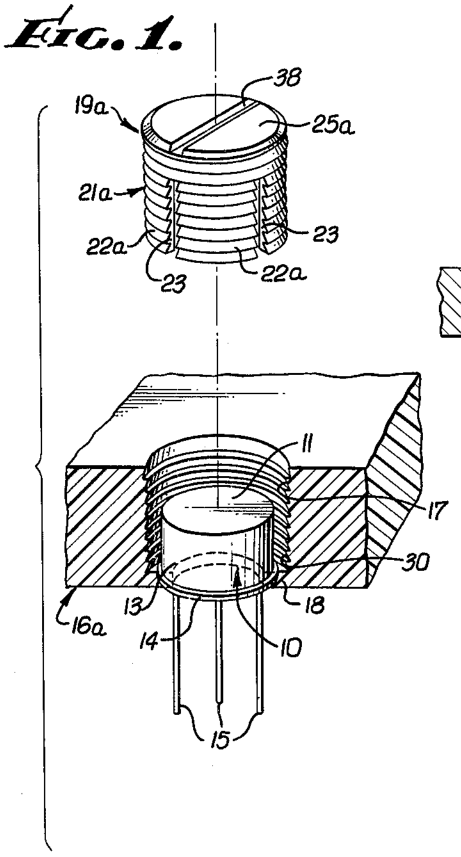
FIG. 1 is an exploded perspective view showing the preferred embodiment of insert body before it is connected into heat sink structure in clamping contact with the semiconductor case.

In accordance with the invention, an insert body 19 is received downwardly in the support opening inwardly of the thread 17. Body 19 is recessed interiorly upwardly at 20 to receive the case 10 inwardly of body wall extent, typically comprising a skirt 21 split in such manner as to allow yieldable inward deflection of the skirt segments 22. As illustrated in FIG. 1, the modified insert body **19*a* has a skirt 21*a* provided with splits 23 at 90 degree intervals about the body axis, so as to form four skirt segments 22*a***.

The body 19 has an interior shoulder 24, typically at the interior side of the body cap 25, located to forcibly engage the upper end 11 of the case and thereby limit upward reception of the case into the body recess without preventing inward deflection of the skirt segments 22. In this regard, the skirt presents exterior camming, typically in the form of screw cam means 26, for screw turning advancement of the insert into the structure 16 and particularly into the thread 17 thereof, bringing the interior shoulder 24 into forcible engagement with the upper end of the case 10. Before such engagement, the thread 26 starts easily into thread 17. In addition, the screw cam means functions to effect cam induced deflection of the skirt inwardly, as illustrated, into forcible contact with the outer side of the case 10 during continued screw turning of the insert in the support, while interior shoulder 24 remains in forcible engagement with the upper end of the case. The interactions of the parts may be considered as effecting an axial compression of the case 10 placing tension loading on the threads 17 and 26, the tips of which are generally cylindrical. The latter loading tends to pull thread 26 up relative to thread 17 so that the wedge faces 30 and 31 of the threads 17 and 26 respectively interact to wedge the thread 26 and the skirt segments 22 inwardly. For this purpose, a buttress-type thread 17 and 26 may be provided.

As a result, an extensive and efficient metal-to-metal heat dissipation path is established through the skirt segments 22 of the body 19 and between the case 10 and support structure 16. In addition, the extensive heat dissipation path through the body 19 may include the cap 25 the underside 24 of which forcibly engages the top end 11 of the case 10. Therefore, the semiconductor within case 10 may be kept at cooler temperature for more efficient and reliable operation, the heat dissipation being carried out with significantly improved efficiency.

FIG. 2 also shows the spacing between the lower terminal end 33 of the skirt 21 and the flange 14, which relationship illustrates the lack of deflection constraint imposed on the skirt by the flange. Projecting upwardly from cap 25 and integral therewith is a stud 34 typically threaded for reception of a nut 35. A mounting panel 36 is held clamped between the nut 35 and cap 25 with the stud projecting through an opening 37 in the panel, thereby establishing a further heat dissipation path from cap 25 to panel 36.

Referring back to FIG. 1, the support structure **16*a* is the same as seen in FIG. 2. However, the cap 25*a* of the insert body 19*a* is grooved at 38** to receive the end of a driving tool such as a screw driver.

Figure 3:
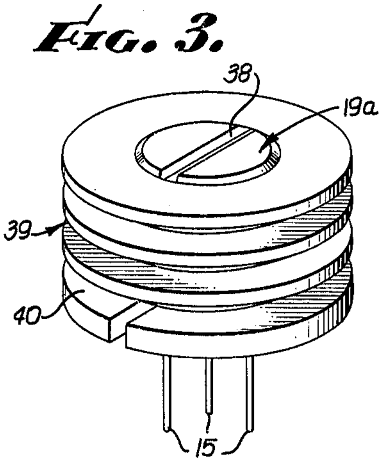
FIG. 3 is a persepctive external elevation showing a finned heat sink with the insert body connected therein.

FIG. 3 illustrates an insert body **19*a* as seen in FIG. 1 which is received downwardly into an externally finned heat sink support 39. The internal configuration of the latter is the same as described in FIGS. 1 and 2; however, externally the support has annular cooling fins 40 for dissipating received heat to the atmosphere. Fins 40** may be anodized for electrically insulating them.

Figure 4:
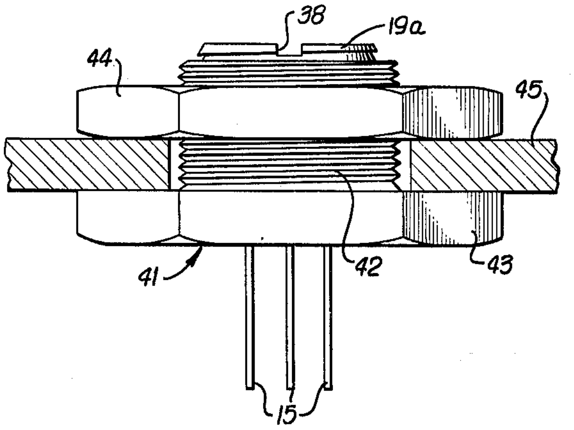
FIG. 4 is a vertical section showing an externally threaded heat sink and insert body assembly connected to a panel.

The heat sink support 41 in FIG. 4 may be of the same internal configuration as the supports 16 and **16*a* in FIGS. 1 and 2. Externally, however, the support 41 is threaded at 42 outwardly of the internal screw cam means, and is also flanged or headed at 43. When a nut 44 is received on the threaded shank 42, it together with head 43 may clamp against a panel 45 for mounting the heat sink 41. Thus, heat may flow from the support head 43 to the panel for radiation therefrom. Electrical insulation may be achieved while maintaining the desired heat conducting path by anodizing or other surface treatment of part 41** for example.

In FIGS. 1 and 2 the support 16 may carry liquid coolant in appropriate ducts, or thermal junctions may be utilized on support 16 to convert heat into electrical energy transmitted by wire.

I claim:

1. In heat dissipation apparatus for a semiconductor case having upper and lower ends and a peripheral outer side, the combination which comprises case supporting structure forming an opening and having a shoulder to support the lower end of the case, an insert body in said opening being recessed interiorly upwardly, said recess being formed by a split body wall to receive said case inwardly of said split body wall, the body having an interior shoulder located to forcibly engage the upper end of the case and thereby limit upward reception of the case into the body recess without preventing inward deflection of said wall extent, the body and said structure respectively having outer and inner thread means presented for camming interengagement acting to flex said body wall extent into forcible contact with the outer side of the semiconductor case thereby establishing an extensive heat dissipation path through said body and between said case and structure during said forcible engagement of the upper end of the case with said body interior shoulder.

2. An insert body as defined in claim 1 in which said body thread means forms a buttress-like thread on skirt segments separated by at least two splits.

3. An insert body as defined in claim 1 in which the body has an upper end cap with said shoulder at the interior side thereof so that said extensive heat dissipation path is provided at the upper end as well as at the side of said case.

4. In heat dissipation apparatus for a semiconductor case having upper and lower ends and a peripheral outer side, the combination which comprises case supporting structure forming an opening and having a shoulder to support the lower end of the case, an insert body advanced by screw turning thereof into said opening, the body being recessed interiorly upwardly and sized to receive said case inwardly of a body skirt, the body having an interior shoulder located to engage the upper end of the case and thereby limit upward reception of the case into the body recess without preventing inward deflection of said skirt, the skirt being split to accommodate said inward deflection, the skirt and said structure respectively having outer and inner thread means presented for camming interengagement for effecting deflection of the skirt inwardly into forcible contact with the outer side of the case during continued turning of the insert while said interior shoulder remains in forcible engagement with said upper end of the case thereby establishing an extensive heat dissipation path through said body and between said case and structure.

5. Apparatus as defined in claim 4 in which said body thread means forms a buttress-like thread on skirt segments separated by at least two splits, the body having an upper end cap with said shoulder at the interior side thereof so that said extensive heat dissipation path is provided at the upper end as well as at the side of said case.

6. Apparatus as defined in claim 5 in which the combination includes said case which has a flange below and in spaced relation to the lower terminal of said skirt, said flange being held clamped against said shoulder on said structure by forcible engagement of the insert body with said case upper end cap.

7. Apparatus as defined in claim 6 including a stud integral with and projecting upwardly from said cap, the stud being shaped for connection to an auxiliary mount.

8. Apparatus as defined in claim 6 in which said structure is externally finned outwardly of said screw cam means.

9. Apparatus as defined in claim 6 in which said structure is externally threaded outwardly of said screw cam means for connection to an auxiliary mount.

References Cited by the Examiner

UNITED STATES PATENTS

| | | | |
|---|---|---|---|
| 1,715,824 | 6/1929 | Duersten | 287—126 X |
| 3,033,537 | 5/1962 | Brown | 174—35.5 X |
| 3,146,384 | 8/1964 | Ruehle | 317—234 |
| 3,150,298 | 9/1964 | Andres | 317—234 |
| 3,171,069 | 2/1965 | Koltuniak et al. | 165—80 X |

ROBERT A. O'LEARY, *Primary Examiner.*

CHARLES SUKALO, *Examiner.*

A. W. DAVIS, *Assistant Examiner.*